(12) United States Patent
Birlingmair et al.

(10) Patent No.: US 7,759,959 B2
(45) Date of Patent: Jul. 20, 2010

(54) VOLTAGE SENSING DEVICE AND ASSOCIATED METHOD

(75) Inventors: Douglas K. Birlingmair, Fort Collins, CO (US); Larry L. Adams, Windsor, CO (US)

(73) Assignee: Primary Integration, Inc., Herndon, VA (US)

( * ) Notice: Subject to any disclaimer, the term of this patent is extended or adjusted under 35 U.S.C. 154(b) by 383 days.

(21) Appl. No.: 11/643,062

(22) Filed: Dec. 21, 2006

(65) Prior Publication Data

US 2007/0096718 A1    May 3, 2007

Related U.S. Application Data

(62) Division of application No. 10/683,920, filed on Oct. 10, 2003, now Pat. No. 7,176,698.

(51) Int. Cl.
    *G01R 31/26* (2006.01)
(52) U.S. Cl. .................................................. 324/765
(58) Field of Classification Search ............. 324/117 H, 324/117 R, 126, 127, 158.1, 765
    See application file for complete search history.

(56) References Cited

U.S. PATENT DOCUMENTS

| | | | |
|---|---|---|---|
| 3,812,428 A * | 5/1974 | Trenkler | 324/127 |
| 4,424,476 A | 1/1984 | Mullersman | |
| 4,554,439 A | 11/1985 | Cross et al. | |
| 4,719,559 A | 1/1988 | Sokal et al. | |
| 5,371,469 A | 12/1994 | Anderson | |
| 5,686,826 A | 11/1997 | Kurtz et al. | |
| 5,999,433 A | 12/1999 | Hua et al. | |
| 6,060,876 A | 5/2000 | Glasband et al. | |
| 6,098,464 A | 8/2000 | Avisse et al. | |
| 6,115,267 A | 9/2000 | Herbert | |
| 6,185,111 B1 * | 2/2001 | Yoshida | 363/17 |
| 6,324,081 B1 | 11/2001 | Sakamoto et al. | |
| 6,538,341 B1 | 3/2003 | Lang | |
| 6,650,552 B2 | 11/2003 | Takagi et al. | |
| 6,741,124 B2 | 5/2004 | Lucas | |

OTHER PUBLICATIONS

Fitzgerald, A. E., Sc.D., et al; "Basic Electrical Engineering" 5th ed., 1981, pp. 57-58.
Williams, J., "Good bridge-circuit design satisfies gain and balance criteria", EDN, Oct. 25, 1990, pp. 161-174.
Klein, William, "Power Combinations Lift Op Amps To Maximum Output", Electronic Design, Jun. 26, 2000, pp. 10-12, 14, 32.
"Bridge Circuit Operation" wwvv.tpub.com/doeinstrument/instrumentationandcontrol18.htm, Apr. 16, 2002, pp. 1-3.

* cited by examiner

*Primary Examiner*—Ha Tran T Nguyen
*Assistant Examiner*—Tung X. Nguyen
(74) *Attorney, Agent, or Firm*—Kelley Drye & Warren LLP

(57) ABSTRACT

A transformer circuit is disclosed that minimizes the temperature dependence of an output voltage. A first embodiment of the present invention includes a primary winding coupled to received a voltage to be sensed and a center-tapped secondary winding coupled at a center point to first voltage output terminal. The center-tapped secondary winding includes a first secondary winding and a second secondary winding, the secondary windings being coupled through a bridge circuit to a second voltage output terminal.

5 Claims, 4 Drawing Sheets

RELATED ART

VOLTAGE SENSING DEVICE AND ASSOCIATED METHOD

CROSS REFERENCE RELATED APPLICATIONS

This application is a divisional of, and takes priority from, co-pending U.S. patent application Ser. No. 10/683,920 filed Oct. 10, 2003, entitled VOLTAGE SENSING DEVICE AND ASSOCIATED METHOD, which application is hereby incorporated by reference in its entirety.

BACKGROUND OF THE INVENTION

1. Field of the Invention

The present invention relates to voltage sensing and transformer circuits.

2. Description of Related Art

Voltage sensing devices are used in various applications to measure voltages. Typical voltage sensing devices include a transformer connected on the primary winding to a voltage to be measured and connected on the secondary winding to a signal processing circuit. The voltage to be measured is transferred through the transformer to the signal processing circuit. The transformer and the signal processing circuit each have certain impedance characteristics. The impedance characteristics affect the voltage that is transferred through the transformer and the signal processing circuit. The voltage received at the signal processing circuit input is processed in light of the transformer and signal processing circuit impedance. The signal processing circuit outputs a value representing the value of the voltage measured. By knowing the impedance characteristics of both the transformer and signal processing circuit, it is possible to indicate a true value of the voltage measured at the output of the signal processing circuit.

Referring to FIG. 1, a typical circuit 100 for voltage sensing and related signal processing is shown. Circuit 100 includes transformer 110 coupled to a scaling circuit 160 comprising resistors 121, 122, and 123. Transformer 110 includes core 115, primary winding 111 and secondary winding 112. Primary winding 111 is coupled to receive a voltage to be sensed (V2, the voltage difference between terminals 11 and 12). As shown, secondary winding 112 is coupled at each respective end to, respectively, resistor 122 and resistor 123. Resistor 122 is coupled to resistor 121 and to voltage output terminal 13 as shown. Similarly, resistor 123 is coupled to resistor 121 and to voltage output terminal 14 as shown.

Voltage output terminals such as terminals 13 and 14 are typically connected to a signal processing circuit such as signal processing circuit 140. The temperature of the voltage sensing device will change due to any change in the ambient temperature of the surrounding environment. Also, when a voltage is transferred through a voltage sensing device, the temperature of the circuit 100 changes because the resistance to current flow of the material and other losses in these components creates heat. A change in temperature also produces a change in impedance in transformer 110 and a change in impedance of the scaling circuit 160.

The change in impedance of the transformer 110 is typically different than the change in impedance of the scaling circuit 160 because of the differences in material Therefore, to accurately indicate the voltage being measured, the impedance characteristics of the transformer 110 and the scaling circuit 160 to which terminals 13 and 14 are connected, as well as the temperature of these components, must be known. Furthermore, the difference between the temperature dependence of the transformer 110 and the temperature dependence of the scaling circuit 160 produces an undesired temperature dependence of the overall circuit 150 (the transformer and scaling circuit combined). As the impedance of transformer 110 changes with a change in temperature, the voltage sensed in the signal processing circuit 140 also changes. This is because the signal processing circuit 140 indicates the voltage measured by processing the voltage Vo, present between nodes 13 and 14, which in turn is affected by the relationship of the impedance of the transformer circuit 110 and the impedance value of the scaling circuit 160. If the impedance value changes due to temperature changes, the voltage received, and therefore the voltage indicated, will be affected.

For example, at room temperature a voltage sensing device might read 100 volts when initially measuring a 100 volt source voltage. As the voltage continues to pass through the components of the voltage sensing and scaling circuit, the temperature changes causing a change in impedance of the overall circuit. As the impedance changes, the voltage received at the signal processing device will be different even though it is still the same 100 volt source being measured. When the voltage received at the signal processing circuit is different, the signal processing circuit will naturally output a different voltage and incorrectly indicate a different measured voltage. In our example, for instance, the voltage sensing device might read 102 volts when the temperature of the components change from room temperature. The change in the voltage measured by the same device as the temperature in the device changes is called voltage offset drift. Voltage offset drift is defined in terms of volts per degree of temperature increase and is caused by the change in impedance of the components in the voltage sensing device. Thus, the temperature dependence of the overall circuit in a voltage sensing device will produce a voltage offset drift that will affect the accuracy of the voltage measurement.

To combat voltage offset drift, conventional devices further process the voltage signal to remove the undesired temperature dependence of the overall circuit. These devices measure either the ambient or actual circuit temperature and then further process the signal to subtract out the offset drift based on the measured temperature. This further processing can be accomplished by summing the signal with a corrective signal to negate the error (offset drift) induced by the temperature change of the circuit and more accurately represent the actual measured voltage signal. However, this approach requires the measurement of the temperature and the use of further processing to arrive at an accurate voltage measurement. It also requires knowledge of the circuit's offset drift value (volts per degree of temperature rise).

However, it would be desirable to provide a voltage sensing circuit that does not require such extensive corrections as must be made with existing systems.

SUMMARY OF THE INVENTION

An embodiment of the present invention provides a voltage sensing/transformer circuit for minimizing the temperature dependence of the impedance, and thus the output voltage, of the circuit.

A first embodiment of the present invention includes a primary winding coupled to receive a voltage to be sensed and a center-tapped secondary winding coupled at a center point to a first voltage output terminal. The center-tapped secondary winding includes a first secondary winding and a second secondary winding, the secondary windings being coupled through a bridge circuit to a second voltage output terminal. In a preferred embodiment, the first and second secondary windings are wound around a core in a bifilar arrangement.

A second embodiment of the invention includes first and second primary windings and first and second secondary windings of first and second transformers. The primary windings are coupled to receive a voltage to be sensed. The secondary windings are coupled to a first voltage output terminal and through a bridge circuit to a second voltage output terminal.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION OF THE PREFERRED EMBODIMENTS

The following description is presented to enable a person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
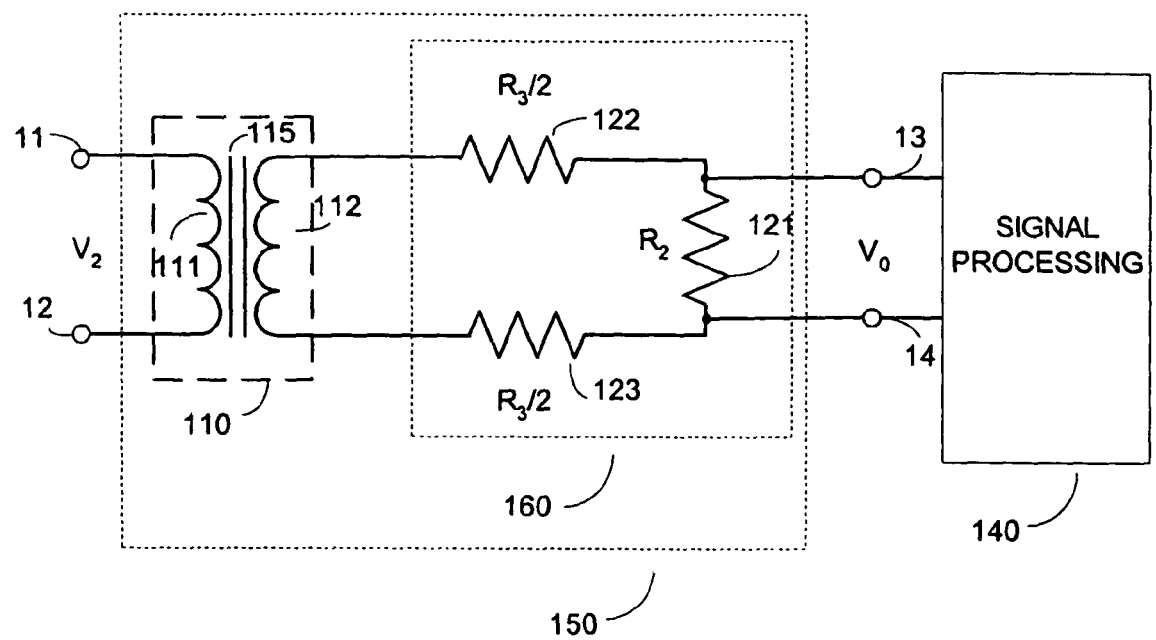
FIG. 1 illustrates a typical existing voltage sensor including a sensing/transformer circuit coupled to a signal processing circuit.
Figure 2:
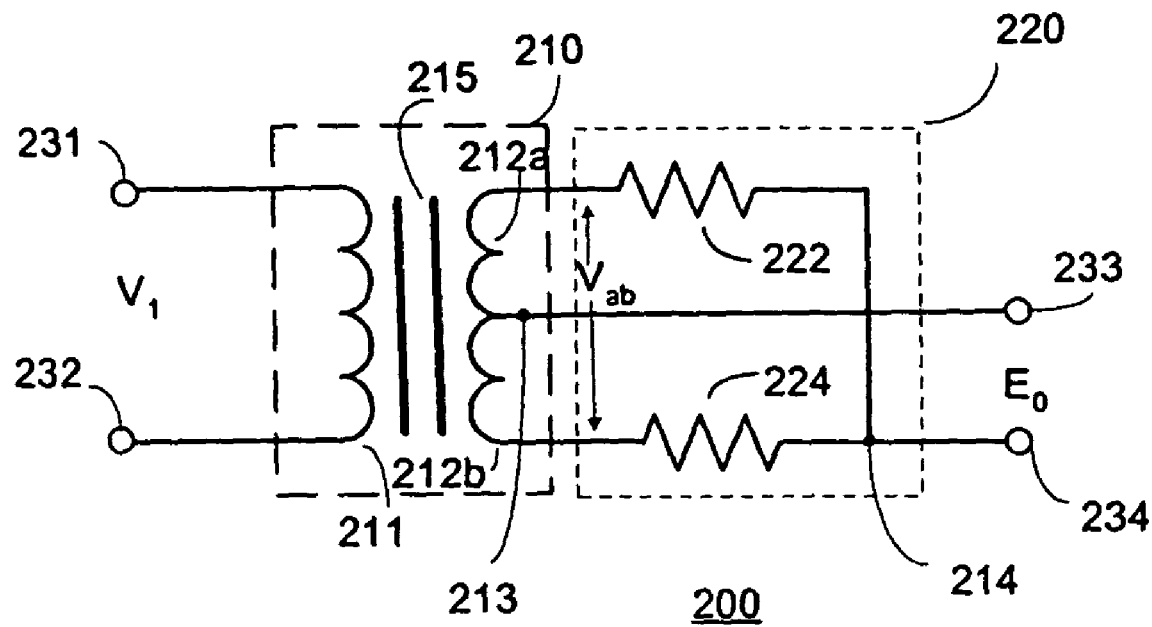
FIG. 2 illustrates a voltage sensing/transformer circuit in accordance with an embodiment of the present invention.

FIG. 2 illustrates a transformer circuit 200 in accordance with a first embodiment of the present invention. Transformer circuit 200 includes transformer 210 and bridge circuit 220. Transformer 210 includes core 215, primary winding 211 and center-tapped secondary winding 212. Primary winding 211 is coupled to receive a voltage to be sensed ($V_1$) across terminals 231 and 232. Center tap secondary winding 212 includes first secondary winding 212a and second secondary winding 212b, which are coupled together at node 213 to output terminal 233. Preferably, the first secondary winding 212a and second secondary winding 212b are wound in a bifilar arrangement. Bifilar windings are generally characterized by wires wound side by side at the same time to ensure equal length and number of windings. The secondary windings 212a and 212b preferably occupy similar positions on core 215, have nearly equal length, the same number of coils, and are made of the same material. This will promote the secondary windings 212a and 212b having equal or nearly equal temperature, flux linkage to the core, impedance, and induced voltage.

Bridge circuit 220 includes a resistor network comprising resistors 222 and 224 coupled as shown. Those skilled in the art will appreciate that the complete bridge circuit present also includes the secondary windings 212a and 212b. However, for purposes herein, the term "bridge circuit" will refer to the network (in this example this network comprises resistors 222 and 224) that may be coupled to a secondary winding to form a complete bridge circuit. In this example, first secondary winding 212a is coupled to resistor 222 which in turn is coupled to resistor 224 and output terminal 234 at node 214. Second secondary 212b winding is coupled to resistor 224 as shown.

Output terminals 233 and 234 may be coupled to another circuit such as a signal processing circuit for processing a voltage signal that is responsive to the received voltage to be sensed. As used herein, "terminal" simply refers to a reference point along a conductor in a circuit. For example, output terminals 233 and 234 simply refer to conductors that link the sensing transformer circuit 200 to additional circuits.

For purposes of this example, the differential voltage ($E_o$) indicates a scaled version of the source voltage to be sensed ($V_1$) on the primary winding 211 of the transformer 210. As will be understood by those skilled in the art, the voltage Eo will also be dependent on impedance characteristics of a circuit such as a signal processing circuit to which terminals 233 and 234 may be coupled. The differential voltage ($E_0$) will be equal to total voltage induced on the secondary windings ($V_{ab}$) minus the voltage drop in the resistive circuit, which is readily calculated using nodal analysis.

In this example:

$$E_0 = V_{ab}\left(\frac{Z1}{Z1 + Z4} - \frac{R2}{R2 + R3}\right) \quad (1)$$

where:
Z1=impedance of the second secondary winding 212b
Z4=impedance of first secondary winding 212a
R2=resistance of second resistor 224
R3=resistance of first resistor 222

During operation of the circuit, the temperature of the circuit changes due to ambient temperature changes, and because of heating due to the current flowing through the transformer and circuit. This temperature change produces a change in the impedance of the coils of the transformer. The change in coil impedance is a natural phenomenon associated with transformers. Assuming, for example, a 10% increase in the impedance of the secondary coils and a 10% increase in the resistance of the bridge circuit resistors. Let $E_o$ be the scaled version of the source voltage to be sensed ($V_1$) assuming the 10% increases in impedance and resistance. Thus:

$$\begin{aligned}E'_0 &= V_{ab}\left(\frac{1.1Z1}{1.1Z1 + 1.1Z4} - \frac{1.1R2}{1.1R2 + 1.1R3}\right) \quad (2)\\ &= V_{ab}\left(\frac{Z1}{Z1 + Z4} - \frac{R2}{R2 + R3}\right)\\ &= E_0\end{aligned}$$

The 10% increase in the impedance of the coils will cancel out and the differential voltage will be the same as the initial starting differential voltage at ambient temperature. At any temperature, the change in impedance of the coils will cancel each other out provided the impedances of the secondary windings do not change relative to each other. Also, the change in resistance of the resistors will cancel out provided these resistances do not change relative to each other. Note also that the resistance in the resistors might change by a different percentage than the percentage change of the coil impedance. As long as the coil impedances do not change relative to each other and the resistor resistances do not change relative to each other, the cancellation effect will allow $E_0$ to be substantially unaffected by temperature changes.

Figure 3:
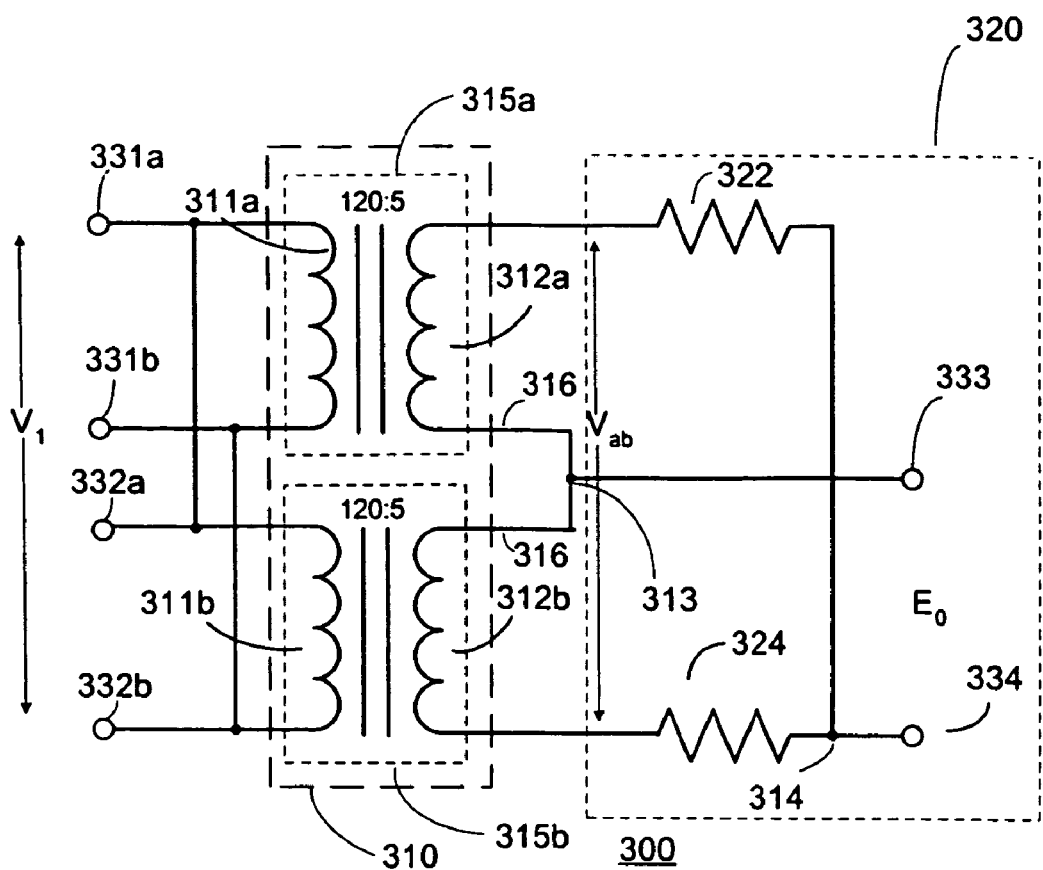
FIG. 3 illustrates a voltage sensing/transformer circuit in accordance with another embodiment of the present invention.

FIG. 3 illustrates a transformer circuit 300 in accordance with an alternative embodiment of the present invention. Transformer circuit 300 includes transformer circuit 310 and bridge circuit 320. Transformer circuit 310 includes first transformer 315a and second transformer 315b, primary windings 311a and 311b and secondary windings 312a and 312b. Primary windings 311 are coupled to receive a voltage to be sensed ($V_1$) across terminals 331a (which is connected to 332a) and 332b (which is connected to 331b). In an alternative embodiment to that shown, the primaries could be connected in series rather than parallel (i.e. connecting 331b to 332a instead of 332b, having no connection from 331a to 332a, and coupling the voltage to be sensed ($V_1$) across 331a and 332b). Continuing with FIG. 3, transformer 315a secondary winding 312a and transformer 315b secondary winding 312b are coupled to node 313 which is coupled to output terminal 333.

Bridge circuit 320 includes a resistor network comprising resistors 322 and 324 coupled as shown. As will be appreciated by those skilled in the art, the complete bridge circuit formed in this example includes secondary windings 312a and 312b coupled to bridge circuit 320 as shown. In particular, transformer 315a secondary winding 312a is coupled to resistor 322 which in turn is coupled to resistor 324 and output terminal 334 at node 314. Transformer 315b secondary winding 312b is coupled to resistor 324 as shown.

Transformer 315a and 315Sb each have a winding ratio of 120:5. This ratio may be chosen to scale the source voltage to a range required by an operational amplifier stage of a signal processing circuit to which transformer circuit 300 may be coupled via terminals 333 and 334. As will be appreciated by those skilled in the art, the transformer winding ratio in this embodiment and in the embodiment of FIG. 2 can be varied according to need and a digital processing circuit to which the transformer circuit 300 is connected does not necessarily require an amplifier stage.

Figure 4:
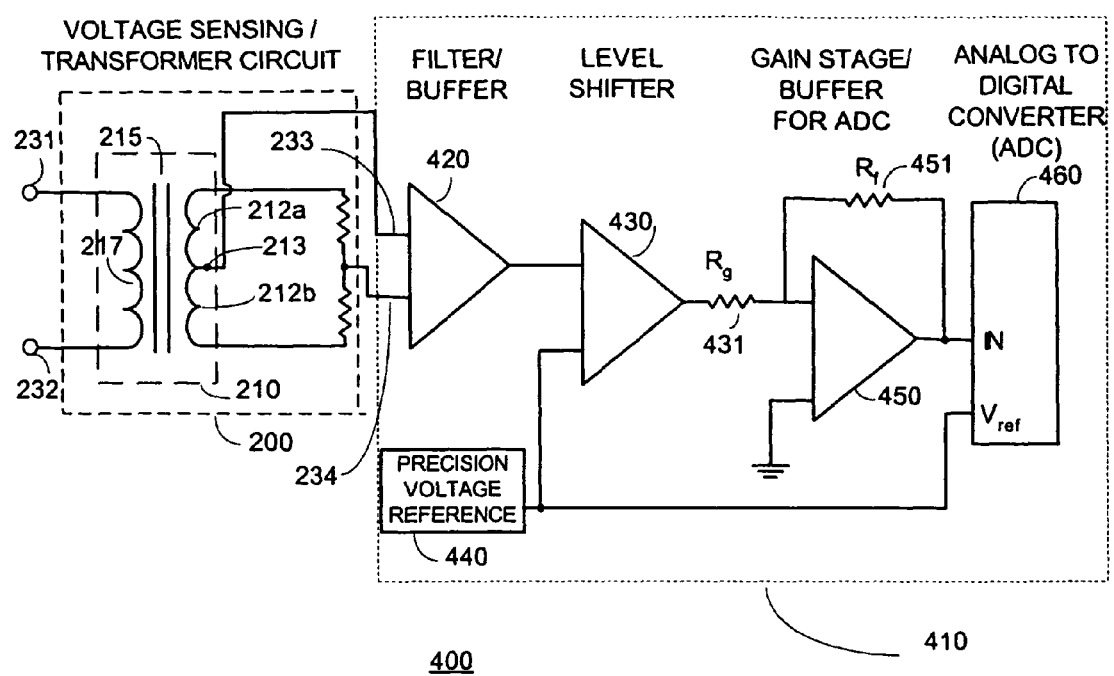
FIG. 4 illustrates a voltage sensing device including the voltage sensing/transformer circuit of FIG. 2 coupled to a signal processing circuit.

FIG. 4 illustrates voltage sensor 400 including the transformer circuit 200 of FIG. 2 coupled to signal processing circuit 410. Signal processing circuit 410 includes filter/buffer 420, level shifter stage 430, precision voltage reference 440, a gain stage/buffer circuit (including op-amp 450, feedback resistor 451, and resistor 431 ), and analog-to-digital converter 460, all coupled as shown. Those skilled in the art will appreciate that signal processing circuit 410 is just one example of a signal processing circuit to which a transformer circuit in accordance with the present invention may be coupled.

Although particular embodiments have been described in detail, various modifications to the embodiments described herein may be made without departing from the spirit and scope of the present invention; thus, the invention is limited only by the appended claims.

What is claimed is:

1. A voltage transformer circuit comprising:
   a primary winding around a core of a first transformer;
   a primary winding around a core of a second transformer, the first and second transformer primary windings being coupled to receive a voltage to be sensed;
   a secondary winding around the core of the first transformer, the secondary winding of the first transformer being coupled to a first output terminal;
   a secondary winding around the core of the second transformer, the secondary winding of the second transformer being coupled to the first output terminal; and
   a bridge circuit coupled to the secondary windings of the first and second transformer and to a second output terminal, wherein said bridge circuit comprises a first resistor and a second resistor, said first resistor having a first and second end, said first end of the first resistor coupled to the secondary winding of said first transformer and said second resistor having a first and second end, said first end of the second resistor coupled to said secondary winding of said second transformer and said second end of the first resistor and said second end of the second resistor coupled to a second output terminal.

2. The voltage sensing and transformer device of claim 1 wherein a winding ratio of the primary windings to the secondary windings is greater than one.

3. The voltage sensing and transformer device of claim 1 wherein a winding ratio of the primary windings to the secondary windings is equal to one.

4. The voltage sensing and transformer device of claim 1 wherein a winding ratio of the primary windings to the secondary windings is less than one.

5. The voltage transformer circuit of claim 1 wherein:
   a number of windings of the first transformer primary winding is equal to a number of windings on the second transformer primary winding; and
   a number of windings of the first transformer secondary winding is equal to a number of windings on the second transformer secondary winding.

* * * * *